United States Patent [19]
Kihara

[11] B 3,989,940
[45] Nov. 2, 1976

[54] BINARY INCREMENTER CIRCUIT
[75] Inventor: Toshimasa Kihara, Kunitachi, Japan
[73] Assignee: Hitachi, Ltd., Tokyo, Japan
[22] Filed: Mar. 20, 1975
[21] Appl. No.: 560,488
[44] Published under the second Trial Voluntary Protest Program on March 16, 1976 as document No. B 560,488.

[30] Foreign Application Priority Data
Mar. 27, 1974 Japan.................................. 49-33566

[52] U.S. Cl. ............................................ 235/175
[51] Int. Cl.² ............................................ G06F 7/50
[58] Field of Search............... 235/175, 168, 92 CP, 235/92 SA; 307/220 R

[56] References Cited
UNITED STATES PATENTS
| | | | |
|---|---|---|---|
| 3,505,511 | 4/1970 | Campano et al..................... | 235/175 |
| 3,603,774 | 9/1971 | DeVarda et al. .................... | 235/168 |
| 3,675,000 | 7/1972 | Lincoln et al....................... | 235/168 |
| 3,704,361 | 11/1972 | Patterson et al................ | 235/92 CP |

OTHER PUBLICATIONS
W. N. Carroll "High–Speed Counter Requiring No Carry Propagation" *IBM Journal* Oct. 1960 pp. 423–425.

J. W. Dieffendeufer "No Ripple Counter with Latch Implementation" *IBM Tech. Disclosure Bulletin* Aug. 1967, pp. 241–245.

J. E. Elliott "Increment–Decrement Logic" *IBM Tech. Disclosure Bulletin* Aug. 1968 pp. 297–298.

*Primary Examiner*—David H. Malzahn
*Attorney, Agent, or Firm*—Craig & Antonelli

[57] ABSTRACT

An incrementer circuit, wherein a "1" is added to binary input information of $n$ digits to provide binary output information, characterized in that output information of the lowest digit is produced as inverted input information by an inverter circuit, and that output information of each of the second-lowest to $n$th digits is produced by passing either input information of the particular digit or its inverted signal from an inverter circuit through a corresponding one of transfer gate transistor paths, which are controlled by the information of the digits lower than the particular digit.

11 Claims, 17 Drawing Figures

BINARY INCREMENTER CIRCUIT

BACKGROUND OF THE INVENTION

1. Field of the Invention

The present invention relates to an incrementer circuit, and is mainly devoted to an incrementer circuit which composes a part of the program counter circuit of a microcomputer constructed of MISFETs (insulated gate field-effect transistors).

2. Description of the Prior Art

As one of the circuits constituting the CPU (central processing unit) of a computer, there is the program counter circuit.

This circuit is necessary for sequentially designating program addresses, and is constructed and operated as will be explained hereunder.

FIG. 12 shows a block diagram of a program counter circuit. As is illustrated in the figure, this circuit is made up of a counter portion (incrementer circuit) 45, a memory portion 46 and gate portions 47 and 48. With this circuit, in the absence of a jump instruction, an address with 1 (one) added to an address which is stored in the memory portion 46 and which is an address presently under execution of a program is formed by the counter portion 45. It is passed through the gate circuit 47, and is stored in the memory portion 46 as a new address. In this manner, program addresses are caused to be sequentially advanced. On the other hand, in the presence of a jump instruction, the jump address is passed through the gate circuit 48 and is stored in the memory portion 46. Thereafter, until the next jump instruction is received, program addresses are caused to be advanced as above by the counter portion 45 on the basis of the jump address.

Depending on whether the jump instruction is present or not, only the input signal of one of the two gate circuits 47 and 48 is stored in the memory portion 46, and the input signal of the other is inhibited. That is, the above operation is carried out by controlling the gate signals $G_1$ and $G_2$ in a complementary manner.

For the program counter circuit, the following two systems have been proposed in the case of the general computers. In one of them, a flip-flop circuit is employed for the memory portion, a 1 (one) is added to the information stored in the flip-flop circuit by the incrementer circuit, and the result is again stored in the flip-flop circuit as new information.

In the other system, a special flip-flop circuit, for example, an R-S type flip-flop circuit, is used as the memory portion, and a carry circuit, for determining if the flip-flop circuit is inverted, is additionally provided. More specifically, as to each of $n$ flip-flop stages for storing information containing $n$ digits, whether or not the particular digit is inverted is determined by the carry circuit in dependence on stored information for digits lower than the digit.

With the former system, the flip-flop circuit is simple in arrangement, but the incrementer circuit is complicated. With the latter system, the flip-flop circuit is complicated in arrangement, and the carry circuit corresponding to the incrementer circuit is simple.

Where the program counter circuit is applied to the CPU of a microcomputer constructed of an MIS integrated circuit, the memory portion is not constructed of a flip-flop circuit and utilizes a part of a RAM (random access memory) space for such purposes as reducing the number of constituent elements. The former system described above has been chiefly adopted.

As the incrementer circuit, the one as shown in FIG. 13 has been commonly employed. As is illustrated in the figure, this circuit is composed of exclusive OR circuits and AND gate circuits. By way of example, where "1" is added to input information containing ($n + 1$) digits at $a_0$–$a_n$, to obtain output information $a_0'$–$a_n'$, the input signal $a_0$ of the least significant digit and the information "1" are first applied to the exclusive OR circuit 49. When the input information of the digit $a_0$ is "1", the output $a_0'$ of the exclusive OR circuit 49 becomes "1" "1" = "0". On the basis of a logical calculation "1" "1" = "0", the least significant digit becomes "0", which is coincident with the above result. When the input information $a_0$ is "0", the output $a_0'$ becomes "1" "0" = "1" and it coincides with a logical calculation "1" "0" = "1".

As regards the second digit, the input information $a_1$ of the digit is applied to one input of the exclusive OR circuit 50, while the input information $a_0$ and the addition information "1" of the digit lower than the second digit are applied through the AND circuit 53 to the other input of the circuit 50. Accordingly, where the output of the AND circuit 53 is "1", that is, where a carry signal from the lower digit is present, the output $a_1'$ of the exclusive OR circuit 50 becomes the inverted signal $\bar{a_1}$ of the input information $a_1$. Where the carry signal is absent, the output $a_1'$ becomes the input information $a_1$ itself. That is to say, in the presence of the carry signal, when the input information $a_1$ of the digit is "1", this information "1" has the carry information "1" added, to make the output information $a_1'$ "0", while when the input information $a_1$ is "0", this information "0" has the carry information "1" added, to make the output information $a_1'$ "1". In the absence of the carry signal, the information to be added to the input information $a_1$ of the digit becomes "0", so that the input information $a_1$ is produced as the output information $a_1'$ without any change.

In the same way, circuits at the digits $a_2$ to $a_n$ are constructed of exclusive OR circuits and AND circuits. At the digit $a_n$, the AND circuit 55 has ($n + 1$) input information (which are not fully illustrated in the figure).

Each of the exclusive OR circuits 49–52 in the foregoing incrementer circuit is composed of NAND circuits 56 and 57 and an OR circuit 58 as shown in FIG. 14. In an MIS integrated circuit which is constructed with an inverter circuit as its fundamental logical circuit, each of the AND circuits 53–55 shown in FIG. 13 is composed of a NAND circuit and an inverter circuit, and the OR circuit 58 shown in FIG. 14 is composed of a NOR circuit and an inverter circuit. Accordingly, where, for example, the circuit of the digit $a_2$ in FIG. 13 is constructed into an MIS integrated circuit, the circuit arrangement is as illustrated in FIG. 15. That is, the AND circuit 54 is composed of a 3-input NAND circuit 62 and an inverter circuit 61, while the OR circuit 58 is composed of a NOR circuit 60 and an inverter circuit 59.

A concrete example of the circuit arrangement is shown in FIG. 16. In order to form the parts 62, 57 and 56 in the figure as NAND circuits and to form the part 60 as a NOR circuit, positive logic must be adopted where MISFETs 63–79 are $p$-channel transistors, whereas negative logic must be adopted where they are $n$-channel transistors.

As is apparent from FIGS. 15 and 16, the circuit arrangement includes a comparatively large number of MISFETs, and a large number of logical steps. When it is constructed of an MIS integrated circuit, there are problems in the operating speed and the degree of integration.

Summary of the Invention

The present invention has been made in order to solve the above problems. The principal object of the present invention is to provide an incrementer circuit which is suitable for use in an MIS integrated circuit. Another object is to provide an incrementer circuit which has a high operating speed. Still another object is to provide an incrementer circuit which has a high degree of integration.

The fundamental construction (1) of the present invention for accomplishing the objects lies in an incrementer circuit which provides binary output information with a "1" added to binary input information containing $n$ digits, and it is characterized in that output information of the lowest digit is produced as an inverted signal of input information by an inverter circuit, and that output information of each of the second-lowest to $n$th digits is produced by passing either input information of the particular digit or its inverted signal for an inverter circuit through a corresponding one of transfer gate transistors which are controlled by the information of the digit lower than the particular digit.

Another construction (2) of the present invention is characterized in that, at each of the second-lowest to $n$th digits of the incrementer circuit defined in the fundamental construction (1), the transfer gate transistor paths producing, as output information, either the input information of the particular digit or its inverted signal from the inverter circuit, comprise transfer gate transistors of the same number as that of the input information of the digits lower than the particular digit connected in series with the inverter circuit, and transfer gate transistors of the same number as that of the series transfer gate transistors connected in parallel with the series circuit consisting of the inverter circuit and the series transfer gate transistors, and that the series transfer gate transistor path and the parallel transfer gate transistor path are paired, the pair of transistor paths being controlled in a complementary manner, so that the series transfer gate transistor path may be rendered conductive by respective information of the digits lower than the particular digit when the respective information delivered to the particular digit is "1".

Another construction (3) of the present invention is characterized in that, at each of the third-lowest to $n$-th digits of the incrementer circuit defined in the construction (2), each parallel transfer gate transistor path which provides the input information of the particular digit as the output information thereof and a series transfer gate transistor path which provides, as output information of the particular digit, the inverted signal obtained by passing the input information of the particular digit through the inverter circuit, is constructed of a single transfer gate transistor, and that the series transfer gate transistor is controlled by a detector circuit which can detect that all input information of the digits lower than the particular digit is "1", while the parallel transfer gate transistor is controlled by the inverted signal of a detection output of the detector circuit.

Another construction (4) of the present invention lies in the incrementer circuit defined in the construction (3), and it is characterized in that the incrementer circuit is constructed of positive logic employing $n$-channel MISFETs or negative logic employing $p$-channel MISFETs, and that the detector circuit is a NOR gate circuit.

Another construction (5) of the present invention lies in the incrementer circuit defined in the construction (3), and it is characterized in that the incrementer circuit is constructed of negative logic employing $n$-channel MISFETs or positive logic employing $p$-channel MISFETs, and that the detector circuit is a NAND gate circuit.

Another construction (6) of the present invention lies in the incrementer circuit defined in the construction (3), and it is characterized in that the series transfer gate transistor of each digit is controlled by a detector circuit which can detect that both the input information of the digit immediately lower than the particular digit and a carry signal at the immediately lower digit are "1", while the parallel transfer gate transistor is controlled by the inverted signal of the output of the detector circuit.

DETAILED DESCRIPTION

In the explanation of the embodiments of the present invention, the circuits are constructed of $p$-channel MISFETs, and positive logic has been adopted.

EMBODIMENT 1

Figure 1:
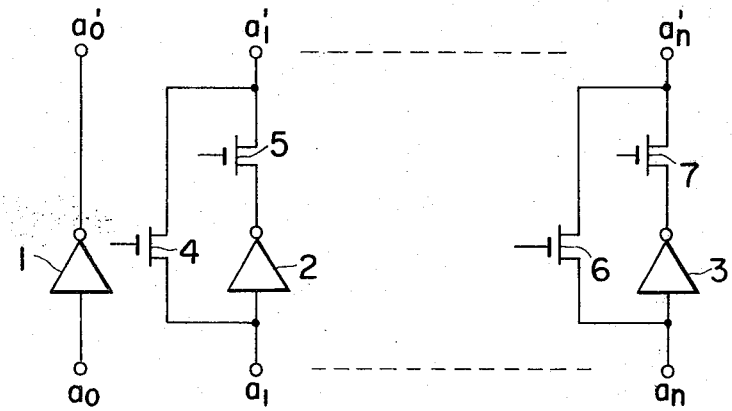
FIG. 1 is a circuit diagram of the fundamental form of the incrementer circuit according to the present invention.

FIG. 1 shows a fundamental circuit for explaining the present invention. As seen in the figure, the circuit is made up of the following arrangement.

1. First, the least significant digit $a_0$ will be described. An inverter circuit 1 is connected between an input information terminal $a_0$ and an output information terminal $a_0'$.
2. Description will now be made of the second digit $a_1$ to the most significant digit $a_n$. Between an input information terminal $a_1$ and an output information terminal $a_1'$, a series circuit consisting of an inverter circuit 2 and a transfer gate transistor 5 is connected, and a transfer gate transistor 4 is connected in parallel with the series circuit. Similar circuits are provided between the input information terminals and output information terminals of the third to $n$th digits, respectively.

The transfer gate transistors at each digit are controlled by information at the digit lower than the particular digit. More specifically, where a carry signal from the lower digit is present, the transfer gate transistor connected in series with the inverter circuit (hereinafter called the series transfer gate transistor) is turned "on", and the inverted signal of an input signal obtained by passing it through the inverter circuit is produced as output information. Where the carry signal is absent, the transfer gate transistor connected in parallel to the inverter circuit and the series transfer gate transistor (hereinbelow called the parallel transfer gate transistor) is turned "on", and input information of the particular digit is produced as output information without any change.

By way of example, this will be explained with respect to the most significant digit $a_n$. In the presence of the carry signal from the lower digit $a_{n-1}$, the series transfer gate transistor 7 is turned "on", and the inverted signal $\overline{a_n}$ of input information $a_n$ obtained by passing it through the inverter circuit 3 is produced at the output terminal $a_n'$. On the other hand, in the absence of the carry signal, the parallel transfer gate transistor 6 is turned "on" and input information $a_n$ is obtained at the output terminal $a_n'$.

Figure 13:
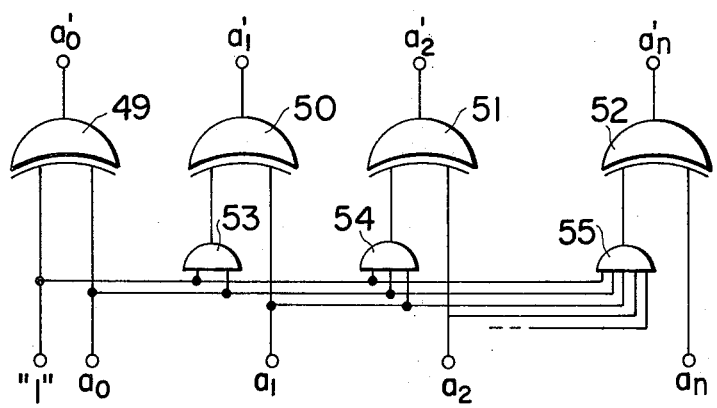
FIG. 13 shows an incrementer circuit which makes use of exclusive OR circuits.
Figure 15:
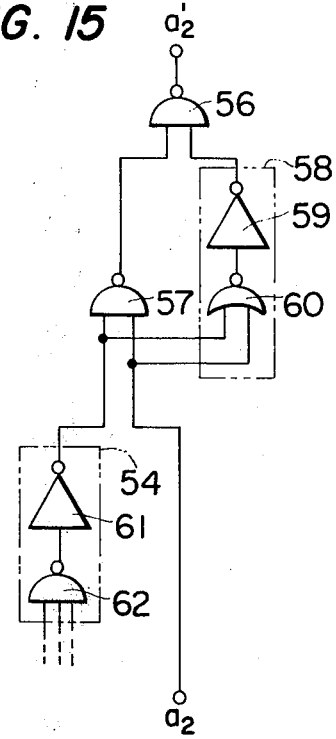
FIG. 15 shows an example of a circuit at a digit $a_2$ in the incrementer circuit of FIG. 13.

The above operation gives the same results as those of the operation of the incrementer circuit utilizing exclusive OR circuits and shown in FIG. 13. The circuit in FIG. 1 can accordingly, be constructed as the incrementer circuit.

Figure 2A:
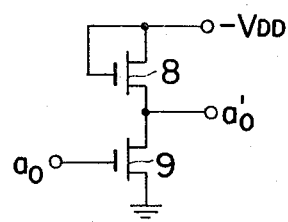
FIGS. 2a and 2b show concrete examples of parts of the circuit in FIG. 1.
Figure 2B:
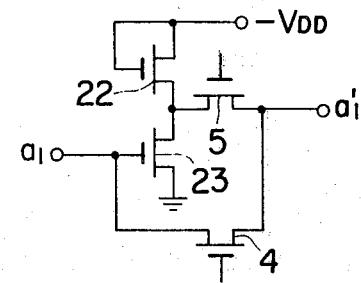

FIGS. 2a and 2b depict concrete examples of the foregoing circuit. FIG. 2a illustrates a concrete form of the circuit of the digit $a_0$. Since the part of the digit $a_0$ is constructed of inverter circuit 1, the circuit in FIG. 2a is a concrete example of the inverter circuit. In the concrete circuit, a load MISFET 8 and a driving MISFET 9 are connected in series with each other between a power source $V_{DD}$ and ground, the gate of the MISFET 9 is the input terminal $a_0$, and the juncture between the load MISFET 8 and the driving MISFET 9 is the output terminal $a_0'$.

FIG. 2b illustrates the concrete form of the circuit of the digit $a_1$. As in the foregoing, the inverter circuit 2 is composed of a load MISFET 22 and a driving MISFET 23. The series transfer gate MISFET 5 is connected between the output terminal of the inverter circuit and the output information terminal $a_1'$. The parallel transfer gate MISFET 4 is connected between the input information terminal $a_1$ and the output information terminal $a_1'$. The parts of the digits $a_2$ to $a_n$ are constructed of the same circuits as in FIG. 2b.

With the foregoing fundamental circuit arrangement of the carry circuit and the transfer gate transistors, a variety of concrete incrementer circuits as explained below can be formed. In order to facilitate an understanding of the circuits, a case of the information of four digits will be referred to hereunder.

EMBODIMENT 2

Figure 3:
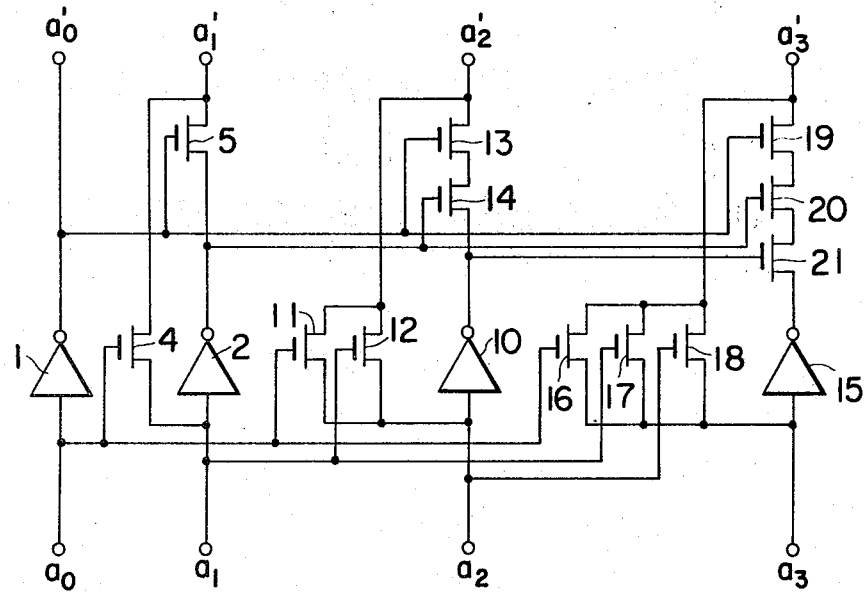
FIGS. 3 to 11 are circuit diagrams showing embodiments of the present invention.

FIG. 3 shows an embodiment of the incrementer circuit according to the present invention. As seen in the figure, the circuit is made up of the following arrangement.

1. First, the part of the lowest digit $a_0$ is constructed of an inverter circuit 1 as in the fundamental circuit of Embodiment 1.
2. Next, regarding the digits of the second-lowest digit $a_1$ to the highest digit $a_3$, transistors of the number of digits lower than the particular digit are provided as series transfer gate transistors which are connected in series with an inverter circuit of the particular digit, while the same number of transistors is provided in correspondence with the series transfer gate transistors as parallel transfer gate transistors which are connected in parallel with the inverter circuit and the series transfer gate transistors of the particular digit. Input information of the digits below the particular digit are applied to the parallel transfer gate transistors. The inverted signals of the input signals of the digits below the particular digit are applied to the series transfer gate transistors.

Accordingly, the part of the second-lowest digit $a_1$ is composed of the inverter circuit 2, the series transfer gate MISFET 5 and the parallel transfer gate MISFET 4. Applied to the series transfer gate MISFET 5 is the output of the inverter circuit 1 of the lower digit $a_0$, namely, the inverted signal $\overline{a_0}$. Applied to the parallel transfer gate MISFET 4 is the input signal of the lower digit $a_0$.

Regarding the third-lowest digit $a_2$, the lower digits are the digits $a_0$ and $a_1$, so that the part of the particular digit $a_2$ is composed of the inverter circuit 10, the two series transfer gate MISFETs 13 and 14 and the two parallel transfer gate MISFETs 11 and 12. The output of the inverter circuit 1 of the digit $a_0$ or the inverted signal $\overline{a_0}$ and the output of the inverter circuit 2 of the digit $a_1$ or the inverted signal $\overline{a_1}$ are respectively applied to the series transfer gate MISFETs 13 and 14. The input signal of the digit $a_0$ and that of the digit $a_1$ are respectively applied to the parallel transfer gate MISFETs 11 and 12.

Regarding the most significant digit $a_3$, the lower digits are the digits $a_0$, $a_1$ and $a_2$, so that the part of the particular digit $a_3$ is composed of the inverter circuit 15, the three series transfer gate MISFETs 19, 20 and 21 and the three parallel transfer gate MISFETs 16, 17 and 18. Likewise to the foregoing, the inverted information $\overline{a_0}$, $\overline{a_1}$ and $\overline{a_2}$ is respectively applied to the series transfer gate MISFETs 19, 20 and 21, while the input information $a_0$, $a_1$ and $a_2$ is respectively applied to the parallel transfer gate MISFETs 16, 17 and 18.

Figure 4:
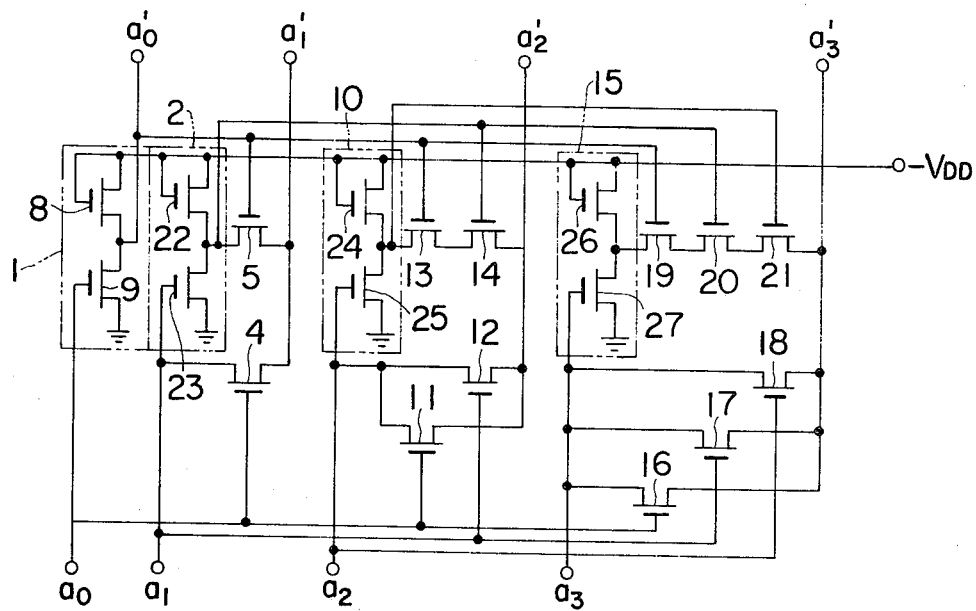

The circuit of the above construction is concretely shown in a circuit diagram of FIG. 4. As is illustrated by broken lines in the figure, the inverter circuits 1, 2, 10 and 15 are respectively constructed of a load MISFET 8 and a driving MISFET 9, a load MISFET 22 and a driving MISFET 23, a load MISFET 24 and a driving MISFET 25, and a load MISFET 26 and a driving MISFET 27.

Referring to the figure, description will now be made of the operation of the incrementer circuit according to the present invention.

Where all the input information of the digits below the particular digit is "1", the circuit composed of the series transfer gate transistors is closed and transmits the inverted signal of the input information of the particular digit to the output terminal of the particular digit. More specifically, where the input information of the particular digit is "1", its inverted signal becomes "0" and the low level is applied to the respective series transfer gate transistors, so that the series transfer gate transistors become conductive. At this time, the input information "1" (the high level) is applied to the parallel transfer gate transistors, so that all the parallel transfer gate transistors become nonconductive. Consequently, where all the lower digits are "1" or where a carry signal is present, the output information of the particular digit is the inverted signal of the input information. Thus, similar to the case of Embodiment 1, the incrementer circuit can be constructed. This will be explained below more concretely.

Assume, by way of example, that the input information $a_3 - a_0$ is "1" "0" "1" and "1", respectively. Then, the digits $a_3$, $a_1$ and $a_0$ are at a high level, and the digit $a_2$ is at a low level.

First of all, since the input information $a_0$ is at the high level and renders the MISFET 9 of the inverter circuit 1 nonconductive, the output $a_0'$ becomes a low level, and the information "0" is obtained at the output terminal $a_0'$.

Secondly, as regards the digit $a_1$, since the input information $a_0$ is at a high level, the parallel transfer gate MISFET 4 becomes nonconductive, and the series transfer gate MISFET 5, to which the low level, the output of the inverter circuit 1, is applied, becomes conductive. Since the input information $a_1$ is at a high level, the MISFET 23 of the inverter circuit 2 becomes nonconductive, and a low level output of the inverter circuit 2 is produced at the output terminal $a_1'$ through the series transfer gate MISFET 5. Accordingly, the information of the output terminal $a_1'$ becomes "0".

Next, as regards the digit $a_2$, since $a_0$ and $a_1$ are at the high level, both the parallel transfer gate MISFETs 11 and 12 become nonconductive. Since the low level outputs of the inverter circuits 1 and 2 are respectively applied to the series transfer gate MISFETs 13 and 14, both become conductive.

Since the input $a_2$ is at the low level, the MISFET 25 of the inverter circuit 10 becomes conductive, and a high level output of the inverter circuit 10 is produced at the output terminal $a_2'$ through the series transfer gate MISFETs 13 and 14.

Lastly, regarding the digit $a_3$, since both the inputs $a_0$ and $a_1$ are at a high level, both the parallel transfer gate MISFETs 16 and 17 become nonconductive, whereas since the input $a_2$ is at a low level, the parallel transfer gate MISFET 18 becomes conductive. Since the series transfer gate MISFETs 19 and 20 have the low level outputs of the respective inverter circuits 1 and 2 applied thereto, they become conductive, whereas, since the series transfer gate MISFET 21 has the high level output of the inverter circuit 10 applied thereto, it becomes nonconductive. Accordingly, the series path composed of the series transfer gate MISFETs 19 – 21 is not closed, and inhibits any information from being supplied to the output terminal $a_3'$ of the inverter 15. In consequence, the high level of the input signal $a_3$ is supplied through the parallel transfer gate MISFET 18 to the output terminal $a_3'$, and the output information of the particular digit $a_3$ becomes "1".

From the above explanation, it will be understood that the output information $a_3' = a_0'$ becomes "1" "1" "0" and "0", which is the same as the result obtained by adding "1" to the input information $a_3 - a_0$ ("1" "0" "1" and "1").

EMBODIMENT 3

Figure 5:
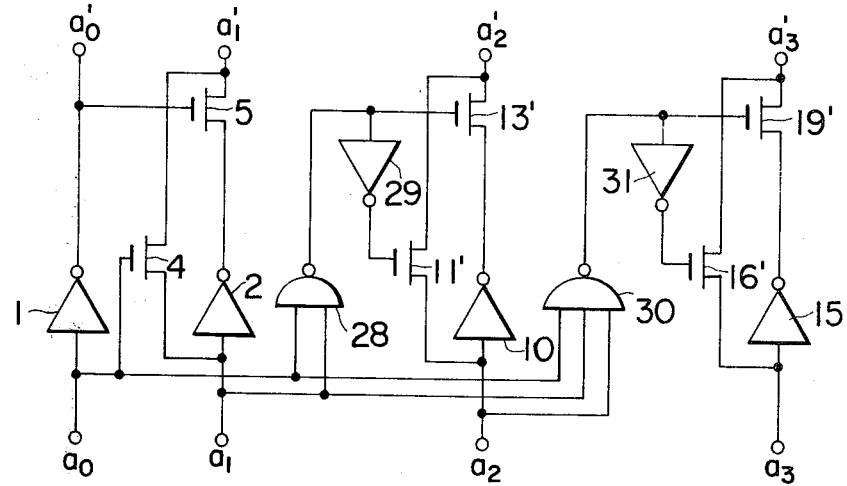

FIG. 5 shows another embodiment of the incrementer circuit according to the present invention. As is seen in the figure, the circuit is made up of the following arrangement.

1. Similarly to the foregoing embodiments, the part of the lowest digit $a_0$ is constructed of an inverter circuit 1.

2. Since the second-lowest digit $a_1$ has only the digit $a_0$ as its lower digit, the part of the digit $a_1$ is herein constructed of an inverter circuit 2, a series transfer gate MISFET 5 and a parallel transfer gate MISFET 4, as in Embodiment 2. Basically, however, it may have a circuit construction of the third-lowest digit $a_3$ to the highest digit $a_4$, as will be explained below. Actually, however, this arrangement is not as preferable as the previous use, since an unnecessary inverter circuit is added.

3. At and above the third-lowest digit $a_2$, each of the series transfer gate transistor path and the parallel transfer gate transistor path of an inverter circuit at a particular digit is constructed of a single transistor for any of these digits. The series and parallel transfer gate transistors are controlled by a circuit which detects a carry signal.

The detector circuit detects that all the input information digits lower than the particular digit are "1". The series transfer gate transistor is controlled by the output of the detector circuit. On the other hand, the parallel transfer gate transistor is controlled by the inverted signal of the detection output.

The part of the digit $a_2$ is composed of an inverter circuit 10, a series transfer gate MISFET 13', a parallel transfer gate MISFET 11', a NAND circuit 28 and an inverter circuit 29. The NAND circuit 28 is the above-stated detector circuit, whose output is applied to the series transfer gate MISFET 13'. The inverter circuit 11' forms the inverted signal of the detection output, and its output is applied to the parallel transfer gate MISFET 11'. The NAND circuit 28 has the input signals of the lower digits $a_0$ and $a_1$ applied to its inputs, and detects if both the input signals $a_0$ and $a_1$ are "1" or not, in other words, is a carry signal is present or not.

Similarly, the part of the highest digit $a_3$ is composed of an inverter circuit 15, a series transfer gate MISFET 19', a parallel transfer gate MISFET 16', a NAND circuit 30 and an inverter circuit 31. The difference from the part of the digit $a_2$ is that, since the part of the digit $a_3$ has the digits $a_0$, $a_1$ and $a_2$ as its lower digits, the NAND circuit 30 is a 3-input one.

The circuit in FIG. 5 is basically the same as in the foregoing embodiments. Where all the input signals of the digits lower than the particular digit are "1", this condition is detected by the NAND circuit. The series transfer gate transistor is rendered conductive. The inverted signal of the input signal of the particular digit is transmitted to the output terminal of the particular digit. In contrast, where the input signals of the lower digits do not fulfill the condition, the parallel transfer gate transistor is rendered conductive. The input information is transmitted to the output terminal of the particular digit.

Figure 6:
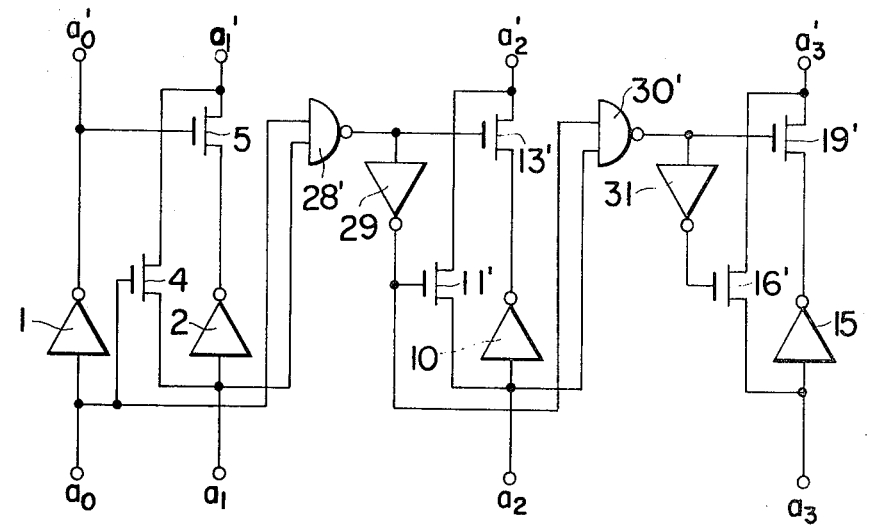
Figure 7:
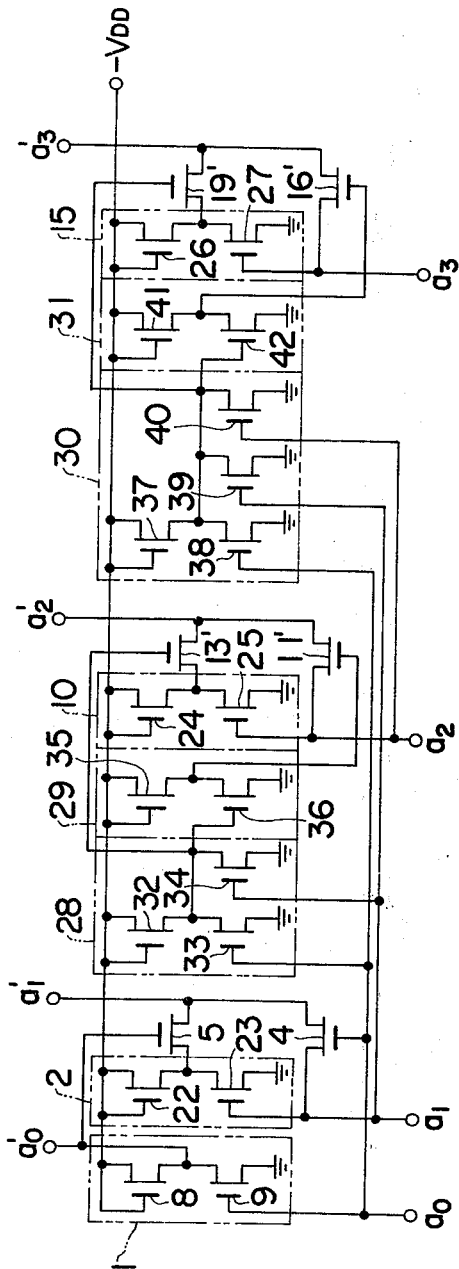

The circuit of the arrangement stated above is concretely shown in the circuit diagram of FIG. 7. The inverter circuits and NAND circuits illustrated by logic symbols in FIG. 5 correspond to circuits indicated by broken lines in FIG. 6. For example, the NAND circuit 28 constituting the carry detector circuit at the digit $a_2$ is constructed such that a load MISFET 32 and parallel driving MISFETs 33 and 34 are connected in series. The information $a_0$ is applied to the gate of the driving MISFET 33, while the information $a_1$ is applied to the gate of the driving MISFET 34. The output of the NAND circuit 28 is applied to the gate of the series transfer gate MISFET 13', and to the gate of the driving MISFET 36 of the inverter circuit 29 serving to form the inverted signal of the output. The output of the inverter circuit 29, namely, a signal at the juncture between load MISFET 35 and driving MISFET 36 is applied to the parallel transfer gate MISFET 11′.

The NAND circuit 30 constituting the carry detector circuit at the digit $a_3$ is constructed such that a load MISFET 37 and parallel driving MISFETs 38, 39 and 40 are connected in series. To the gates of the respective driving MISFETs 38 – 40 as are the inputs of the NAND circuit 30, the signals $a_0 - a_2$ are applied. The output of the NAND circuit 30 is applied directly to the series transfer gate MISFET 19′, and is also applied to the parallel transfer gate MISFET 16′ through the inverter circuit 31 which serves to form the inverted signal of the output and which consists of a load MISFET 41 and a driving MISFET 42.

The remaining circuitry is as explained with reference to FIG. 5. Since the parts of the digits $a_0$ and $a_1$ have the same circuitry as in Embodiment 2, they are not described here.

Referring to the circuit arrangement in FIG. 7, the operation will now be set forth concretely.

As in the foregoing, the inputs $a_3 - a_0$ are presumed to be "1" "0" "1" "1". Then, the signals $a_3$, $a_1$ and $a_0$ are at a high level, while the signal $a_2$ is at a low level. At the digits $a_0$ and $a_1$, the signals $a_0'$ and $a_1'$ are the low level outputs or the output information are "0", as in Embodiment 2.

At the digit $a_2$, since both the inputs $a_0$ and $a_1$ of the NAND circuit 28 are at a high level, both the driving MISFETs 33 and 34 become nonconductive. The output of the NAND circuit 28 therefore becomes the low level, to render the series transfer gate MISFET 13′ conductive and to render the driving MISFET 36 of the inverter circuit 29 conductive. Owing to the conduction of the driving MISFET 36 the output of the inverter circuit 29 becomes a high level, so that the parallel transfer gate MISFET 11′ becomes nonconductive. Consequently, since the input $a_2$ is at a low level, the driving MISFET 25 of the inverter circuit 10 becomes conductive. The output high level of the inverter circuit 10 is supplied through the series transfer gate MISFET 13′ to the output terminal $a_2'$, and makes the output information a "1".

Lastly, as regards the digit $a_3$, the driving MISFETs 38 and 39 are rendered nonconductive because the inputs $a_0$ and $a_1$ of the NAND circuit 30 are at a high level, whereas the driving MISFET 40 is rendered conductive by the low level of the input $a_2$ and accordingly has its output at a high level. The series transfer gate MISFET 19′ to which the high level output is applied becomes nonconductive. On the other hand, the driving MISFET 42 of the inverter circuit 31 is rendered nonconductive by the high level output. The output of the inverter circuit 31 therefore becomes low, to render the parallel transfer gate MISFET 16′ conductive. Consequently, the input $a_3$ is transmitted through the parallel transfer MISFET 16′ to the output terminal $a_3'$, and makes the output information a "1".

It will be understood that, as the result of the foregoing, the outputs $a_3' - a_0'$ become "1" "1" "0" "0", which is equal to the result obtained by adding "1" to the input information "1" "0" "1" "1".

EMBODIMENT 4

FIG. 6 shows another embodiment of the incrementer circuit according to the present invention. As depicted in the figure, the cicuit has the following arrangement.

1. The part of the least significant digit $a_0$ is constructed of an inverter circuit 1, as in Embodiment 3. Regarding the second-lowest digit $a_1$, since the lower digit is only the digit $a_0$, the part is constructed of an inverter circuit 2, a series transfer gate MISFET 5 and a parallel transfer gate MISFET 4, as in the foregoing.
2. At the third-lowest digit $a_2$ and higher digits, a point of difference from Embodiment 3 lies in a carry detector circuit. This detector circuit does not receive as its inputs, all the input information of the digits lower than the particular digit as does the carry detector circuit of Embodiment 3, but it utilizes a carry output at the digit immediately lower than the particular digit. More specifically, the detector circuit of this embodiment monitors that all the digits lower than the particular digit are "1", by detecting that both the carry output at the immediately lower digit and the input information of the particular digit are "1".

As regards the digit $a_2$, since the lower digits are the digits $a_0$ and $a_1$, the circuit construction is the same as Embodiment 3. As regards the digit $a_3$, a NAND circuit 30′ for detecting a carry signal is constructed of a 2-input NAND circuit. Applied to one input of the 2-input NAND circuit 30′ is the input signal of the immediately lower digit $a_2$, while applied to the other input is the inverted signal of the output of a carry circuit (NAND circuit 28′) at the immediately lower digit $a_2$.

The above NAND circuit can detect that all the input signals of the digits lower than the particular digit are "1", since where the detector circuit has detected the carry signal at the digit immediately below the particular digit, all the input signals at the digits lower than the immediately lower digit are "1", the input information of the immediately lower digit being a "1". The output of the detector circuit controls the series transfer gate transistor, and the inverted signal of the output controls the parallel transfer gate transistor. The incrementer circuit can therefore be constructed as in the foregoing.

Figure 8:
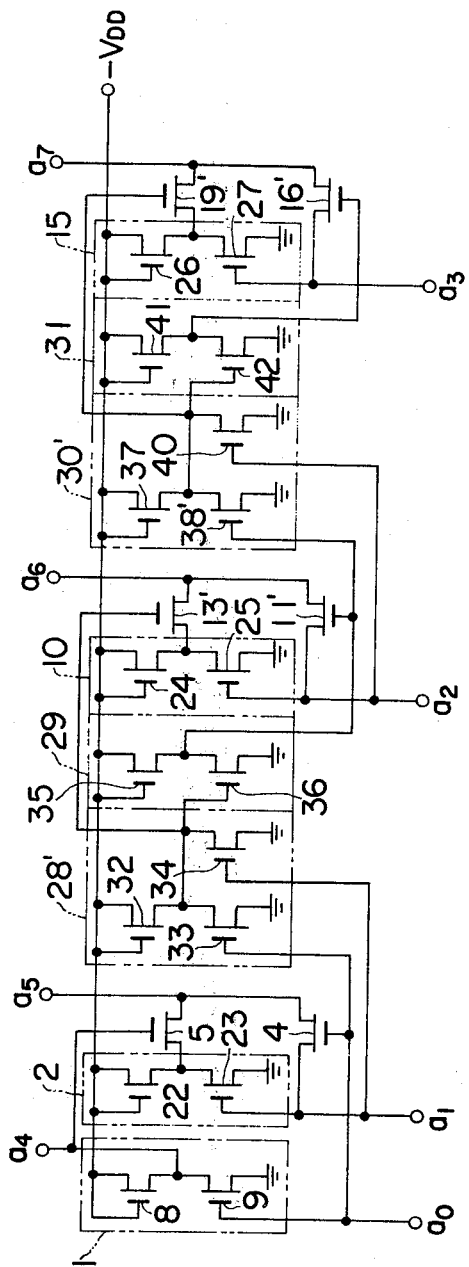

This will become apparent from the following explanation of the operation taken with reference to FIG. 8 which shows a concrete form of the circuit of FIG. 6.

The inverter circuits and NAND circuits illustrated by logic symbols in FIG. 6 correspond to circuits indicated by the broken lines in FIG. 8. For example, the NAND circuit 30′ constructing the carry detector circuit at the digit $a_3$ is a 2-input NAND circuit such that a load MISFET 37 and parallel driving MISFETs 38′ and 40 are connected in series. To the gate of the driving MISFET 38′ as is one input terminal of the NAND circuit 30′, the inverted signal of the carry signal of the immediately lower digit $a_2$ or the output of the inverter circuit 29 is applied. To the gate of the driving MISFET 40 as is the other input terminal of the NAND circuit 30′, the input signal of the immediately lower digit $a_2$ is applied. The remaining circuitry is the same as in the circuit of FIG. 7 explained in Embodiment 3, and the explanation is not repeated here.

Assuming that the input information $a_3 - a_0$ in the circuit of FIG. 8 are "1" "0" "1" "1" as in the foregoing, the signals $a_3$, $a_1$ and $a_0$ become the high level, and the signal $a_2$ becomes the low level. In the first place, at the digits $a_0$, $a_1$ and $a_2$, the outputs $a_0'$ and $a_1'$ become the low level and the output $a_2'$ becomes the high level as in Embodiment 3.

In the next place, as regards the digit $a_3$, the output of the inverter circuit 29 is applied to the gate of the driving MISFET 38' as is one input of the NAND circuit 30', the output of the NAND circuit 28' is applied to the inverter circuit 29, and the high level signals $a_0$ and $a_1$ are respectively applied to the driving MISFETs 33 and 34 of the NAND circuit 28'. Thus, both the driving MISFETs 33 and 34 become nonconductive, to supply the low level to the driving MISFET 36 of the inverter circuit 29. The driving MISFET 36 is rendered conductive by the low level and supplies the high level to the driving MISFET 38' of the NAND circuit 30', so that the driving MISFET 38' becomes nonconductive. The gate of the driving MISFET 40 being the other input of the NAND circuit 30' has the low level signal $a_2$ supplied thereto, so that the driving MISFET 40 becomes conductive. Consequently, the output of the NAND circuit 30' becomes the high level and renders the series transfer gate MISFET 19' nonconductive. On the other hand, the driving MISFET 42 of the inverter circuit 31 is rendered nonconductive by the high level output. Therefore, the output of the inverter circuit 31 becomes the low level and renders the parallel transfer gate MISFET 16' conductive.

In this manner, the input information $a_3$ is transmitted through the parallel transfer gate MISFET 16 to the output terminal $a_3'$ and makes the output information "1".

As the result of the foregoing, the output information $a_3' - a_0'$ become "1" "1" "0" "0", which are equal to the result obtained by adding "1" to the input information "1" "0" "1" "1".

Table 1 shows the numbers of elements and the occupying areas of the incrementer circuits according to the present invention and the incrementer circuit utilizing the exclusive OR circuits as have been explained above.

In the table, "the occupying area" indicates an area occupied by the elements in the case where the circuit is constructed at the rate of 1 for the load MISFET, 2 for the transfer gate MISFET and 10 for the driving MISFET. The expression "10 for the driving MISFET" means that the ratio between the conductances of the MISFETs of the load portion and the driving portion is 1 : 10. Where $n$ MISFETs constituting the driving portion are connected in series, the conductance of each of the driving MISFETs must be made $n$ times higher in order to keep the conductance of the driving portion at 10.

On the basis of the foregoing, Table 1 will now be explained.

Table 1

| Digits | Prior Art Number of Elements | Prior Art Occupying Area | Embodiment 2 Number of Elements | Embodiment 2 Occupying Area | Embodiment 3 Number of Elements | Embodiment 3 Occupying Area | Embodiment 4 Number of Elements | Embodiment 4 Occupying Area |
|---|---|---|---|---|---|---|---|---|
| 1 | 11 | 94 | 2 | 11 | 2 | 11 | 2 | 11 |
|  | 11 | 94 | 2 | 11 | 2 | 11 | 2 | 11 |
| 2 | 16 | 123 | 4 | 15 | 4 | 15 | 4 | 15 |
|  | 17 | 133 | 6 | 19 | 9 | 47 | 6 | 26 |
| 3 | 27 | 217 | 6 | 26 | 6 | 47 | 9 | 47 |
|  | 18 | 143 | 8 | 23 | 10 | 57 | 15 | 73 |
| 4 | 44 | 350 | 12 | 454 | 15 | 73 | 9 | 47 |
|  | 19 | 153 | 10 | 27 | 11 | 67 | 24 | 120 |
| 5 | 62 | 493 | 20 | 68 | 25 | 130 | 9 | 47 |
|  | 20 | 163 | 12 | 31 | 12 | 77 | 33 | 167 |
| 6 | 81 | 646 | 30 | 95 | 36 | 197 | 9 | 47 |
|  | 21 | 173 | 14 | 35 | 13 | 87 | 42 | 214 |
| 7 | 101 | 809 | 42 | 126 | 48 | 274 | 9 | 47 |
|  | 22 | 183 | 16 | 39 | 14 | 97 | 51 | 261 |
| 8 | 122 | 982 | 56 | 161 | 61 | 361 | 9 | 47 |
|  | 23 | 193 | 18 | 43 | 15 | 107 | 60 | 308 |
| 9 | 144 | 1165 | 72 | 200 | 75 | 458 | 9 | 47 |
|  | 24 | 203 | 20 | 47 | 16 | 117 | 69 | 355 |
| 10 | 167 | 1358 | 90 | 243 | 90 | 565 | 9 | 47 |
|  | 25 | 213 | 22 | 51 | 17 | 127 | 78 | 402 |
| 11 | 191 | 1561 | 110 | 290 | 106 | 682 | 9 | 47 |
|  | 26 | 223 | 24 | 55 | 18 | 137 | 87 | 449 |
| 12 | 216 | 1774 | 132 | 341 | 123 | 809 | 9 | 47 |
|  | 27 | 233 | 26 | 59 | 19 | 147 | 96 | 496 |
| 13 | 242 | 1997 | 156 | 396 | 141 | 946 | 9 | 47 |
|  | 28 | 243 | 28 | 63 | 20 | 157 | 105 | 543 |
| 14 | 269 | 2230 | 182 | 455 | 160 | 1093 | 9 | 47 |
|  | 29 | 253 | 30 | 67 | 21 | 167 | 114 | 590 |
| 15 | 297 | 2473 | 210 | 518 | 180 | 1250 | 9 | 47 |
|  | 30 | 263 | 32 | 71 | 22 | 177 | 123 | 637 |
| 16 | 326 | 2726 | 240 | 585 | 201 | 1317 | 9 | 47 |
|  | 356 | 2989 | 272 | 656 | 223 | 1494 | 132 | 686 |

Figure 16:
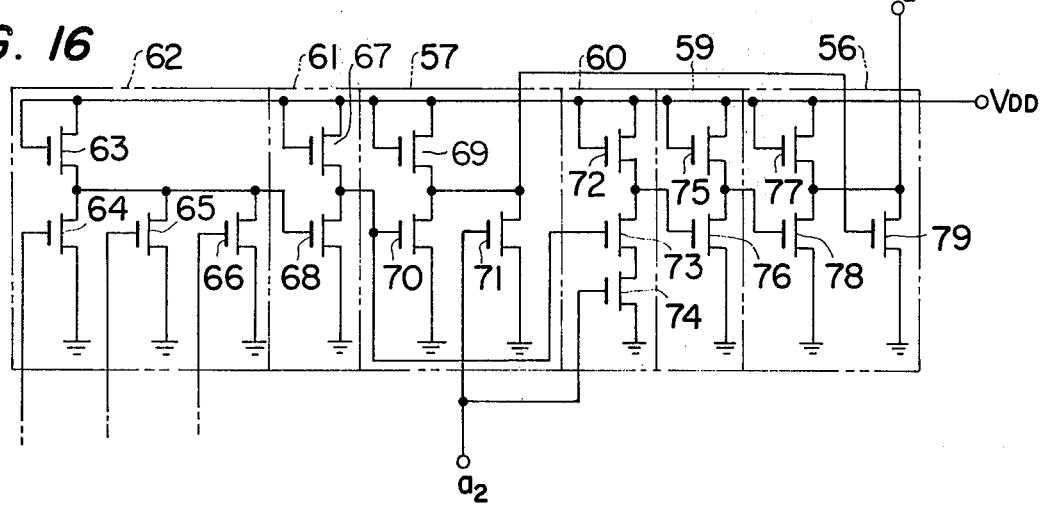
FIG. 16 shows a concrete example of the circuit of FIG. 15.

In the case of the incrementer circuit utilizing the exclusive OR circuits as has been described as the example of the prior art, the first digit is made up only of the exclusive OR circuit. The exclusive OR circuit is composed of the NAND circuits 56 and 57, the NOR circuit 60 and the inverter circuit 59 as shown in FIG. 16. The number of elements is 11, and is indicated in the upper row in the table. As regards the occupying area, the load MISFETs have a value of 4, and the driving MISFETs have a value of 90 because the driving portion of the NOR circuit 60 is constructed of the series circuit and hence each of the MISFETs 73 and 74 has a value of 20. Accordingly, the occupying area becomes 94 which is indicated in the upper row in the table.

At and above the second digit, the NAND circuit and the inverter circuit are added to the exclusive OR circuit stated above. As the digit increases, the NAND circuit must increase the number of inputs. Therefore, the numbers of elements become 16, 17 . . . , while the occupying areas become 123, 133 . . . . These values are respectively indicated in the upper rows in the table. Numerals given in the lower rows in the table indicate the summations.

Regarding the circuit of Embodiment 2, the first digit is constructed only of the inverter circuit. Therefore, the number of elements is 2, and the occupying area has a value of (1 + 10) or 11. As the digit increases, one series transfer gate transistor and one parallel transfer gate transistor are added. Therefore, the number of elements increases by every 2, and the occupying area increases by every 4. These are indicated in the upper row, and the summations are indicated in the lower row.

In the circuit of Embodiment 3, the first and second digits are the same as those of the above circuit, but the NAND circuit and the inverter circuit are added at and above the third digit. Since the NAND circuit increases the number of inputs with every increase of the digit, the number of elements increases by 1 and the occupying area by 10. The indications in the table are the same as in the above.

In the circuit of Embodiment 4, the first to third digits are the same as in the above circuit. At and above the fourth digit the circuit arrangement is the same as at the third digit, so that neither the number of elements nor the occupying area increases with the increase of the digit as seen in the table.

As is apparent from Table 1, in case of constructing the incrementer circuit of, for example, 16 digits, the incrementer circuit according to the present invention can reduce the number of elements in comparison with the incrementer circuit composed of the exclusive OR circuits. As to the occupying area, a sharp reduction is possible.

Regarding the operating speed, the circuit of Embodiment 2 is 1 and that of Embodiment 3 is 2 in the number of logic stages, and they can therefore be made highly speedy in operation.

According to the present invention, in case of constructing the circuit with positive logic employing $p$-channel MISFETs, the carry signal detector circuit is formed of the NAND circuit, and the driving MISFETs of the driving portion of the NAND circuit are arranged into the parallel circuit. For this reason, the driving MISFET can be formed at a rate of occupying area of 10 relative to the load MISFET, and the increase of the occupying area is preventable. Likewise, in case of constructing the circuit of $n$-channel MISFETs, the same effect is achieved by adopting negative logic.

In case of constructing the circuit with positive logic employing n-channel MISFETs or with negative logic employing p-channel MISFETs, the same effect is attained by utilizing NOR circuits as stated below.

Figure 10:
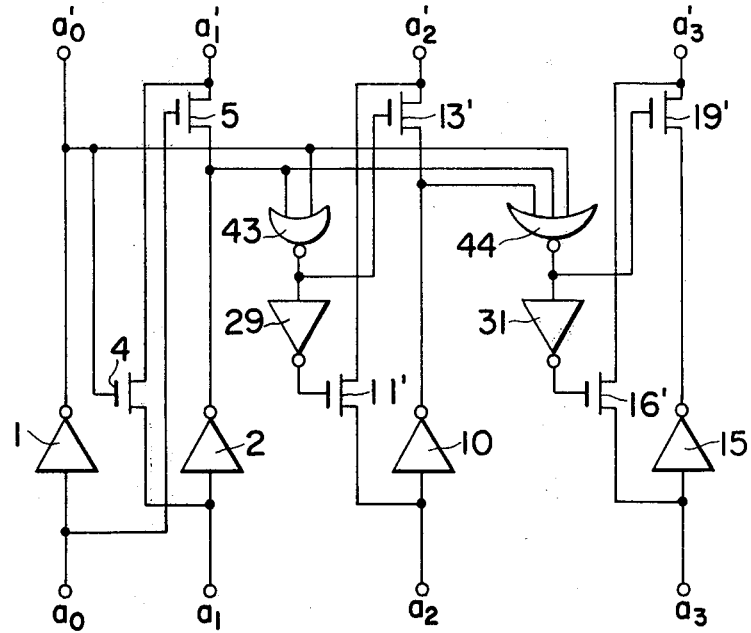

FIG. 10 shows an example of circuit in which the NOR circuit is used as the carry signal circuit. This circuit is a modification of the circuit of Embodiment 3. Different from Embodiment 3 (FIG. 5) are that NOR circuits 43 and 44 are disposed in place of the NAND circuits 28 and 30 and that the input signals of the NOR circuits become $\overline{a_0}$, $\overline{a_1}$ and $\overline{a_2}$. Further, the signal which is applied to the series transfer gate MISFET 5 at the digit $a_1$ becomes $\overline{a_0}$, and the signal which is applied to the parallel transfer gate MISFET 4 becomes $a_0$.

Figure 11:
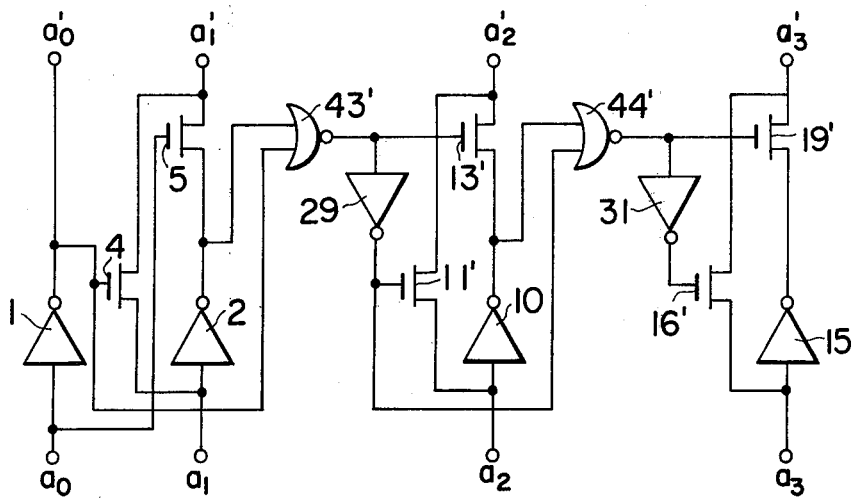
Figure 12:
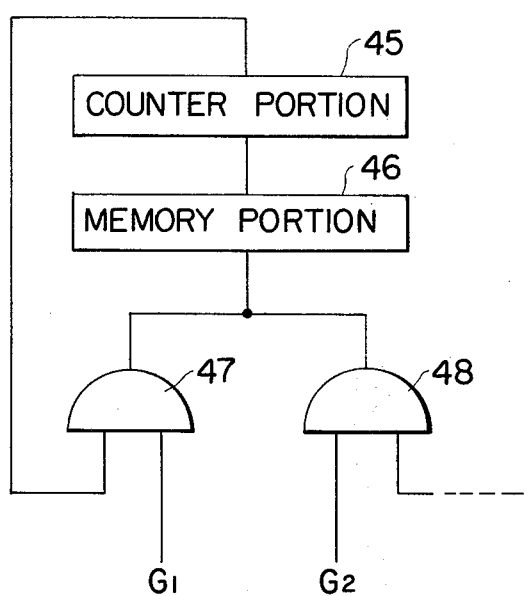
FIG. 12 is a block diagram of a program counter circuit.
Figure 14:
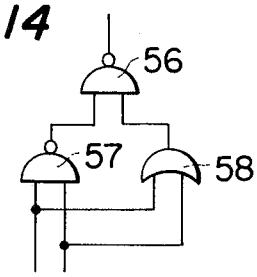
FIG. 14 shows an exclusive OR circuit.

FIG. 11 shows a modification of the circuit of Embodiment 4 (FIG. 6). The NAND circuits 28' and 30' are replaced with NOR circuits 43' and 44'. The method of application of the input signals is the same as in the above. It will be readily understood that a concrete form of the NOR circuit in the two circuit arrangements described above is the same as the NAND circuit illustrated in FIGS. 7 and 8.

Since the circuit according to the present invention as stated above is constructed of the NAND circuits or NOR circuits in unity, the occupying area can be minimized by adopting the foregoing method. In constrast, in the case of utilizing the exclusive OR circuits, the NAND circuits and NOR circuits are included. In either of them, therefore, the driving portion must always be composed of driving MISFETs connected in series. This is obviously disadvantageous in enhancing the degree of integration.

Figure 9:
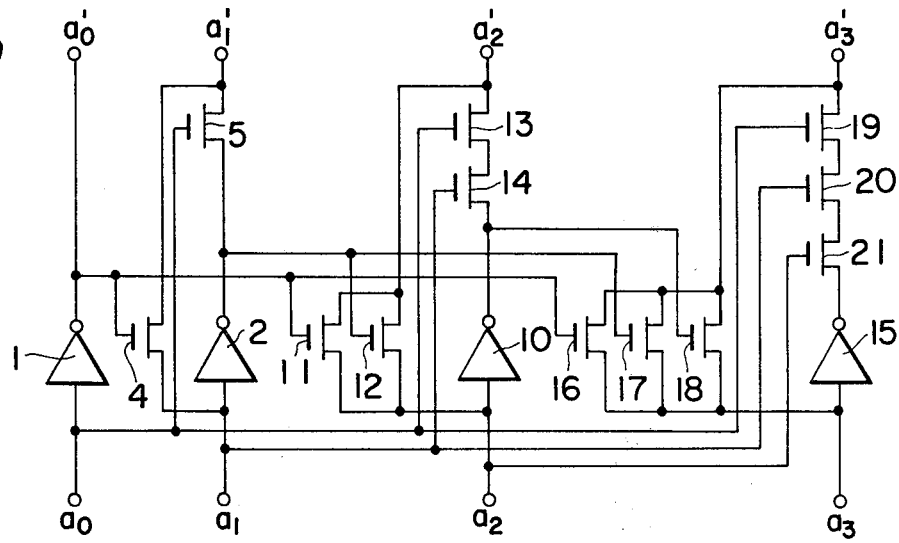

FIG. 9 shows a modification of the circuit in FIG. 3, which adopts the positve logic employing $n$-channel MISFETs or the negative logic employing $p$-channel MISFETs. Since this circuit utilizes no NAND circuit, it can be constructed by reversing the signals which are applied to the series transfer gate transistor and the parallel transfer gate transistor, to those in the case of the circuit of FIG. 3.

The present invention can have a variety of modifications on the basis of the foregoing embodiments. For example, an incrementer circuit of $n$ digits may be constructed by combining the circuits of Embodiments 2, 3 and 4. It is also allowed that the signals of $n$ digits are divided into $m$ sets and that circuits are constructed in the series system for the signals of each of the $m$ sets.

Where the inverted signal of an input signal is easily obtained, the series transfer gate transistor may be connected on the input side of the inverter circuit.

The carry detector circuit for controlling the series and parallel transfer gate transistors may be any circuit other than the NAND circuit and the NOR circuit.

Besides the incrementer circuit of the CPU of a microcomputer, the present invention can be extensively utilized as a circuit which adds "1" to a binary information of $n$ digits.

What is claimed is:

1. An incrementer circuit comprising:
    a plurality of $n$-input terminals for receiving signals representative of $n$ binary digits;
    a plurality of $n$-output terminals for supplying signals representative of the addition of a "1" to said $n$ binary digits; and a plurality of coupling circuits, connected between said input terminals and said output terminals, for effecting the addition of a "1" to said $n$ binary digits and coupling signals representative of the incremented number to said plurality of output terminals, wherein the coupling circuit for the lowest digit comprises an inverter circuit connected between the input and output terminals for said lowest digit, and the coupling circuit for each of the second-lowest to $n$th digit comprises an inverter circuit coupled between the input and output terminals for that particular digit, and a transfer gate circuit, responsive to the signals representative of the digits lower than that particular digit, for connecting the input terminal for that particular digit to the output terminal for that particular digit through one of a direct non-inverted connection and invertedly through said inverter circuit.

2. An incrementer circuit according to claim 1, wherein said transfer gate circuit comprises:

($m$-1) first transfer gate switching elements connected in series between said inverter circuit and the output terminal for that particular $m$th digit, and ($m$-1) second transfer gate switching elements connected in parallel across the input and output terminals for that particular $m$th digit, and wherein said first transfer gate switching elements are controlled by the outputs of the inverter circuits of the lowest digit to the ($m$-1)th digit, and said second transfer gate switching elements are controlled by the signals applied to the input terminals of the lowest digit to the ($m$-1)th digit.

3. An incrementer circuit according to claim 1, wherein said transfer gate circuit comprises:

a first transfer gate switching element connected in series between said inverter and the output terminal for that particular digit, a second transfer gate switching element connected across the input and output terminals for that particular digit, and wherein each $m$th coupling circuit for each of the third lowest to the $n$ th digit further comprises a detector circuit having a plurality of inputs connected to the input terminals for the lowest to the ($m$-1)th digit and an output connected to the first transfer gate switching element, and an inverter circuit connected between the output of the detector circuit and the second transfer gate switching element, each detector circuit providing an output in response to each of its inputs being a "1".

4. An incrementer circuit according to claim 1, wherein said transfer gate circuit comprises:

a first transfer gate switching element connected in series between said inverter and the output terminal for that particular digit, a second transfer gate switching element connected across the input and output terminals for that particular digit, and wherein each $m$th coupling circuit for the third lowest to the $n$th digit further comprises a NAND circuit having first and second inputs connected to the input terminal for the ($m$-1)th digit and the control electrode of the second transfer gate switching element for the ($m$-1)th digit, respectively, and an output connected to the control electrode of the first transfer gate switching element for that $m$th digit, and an inverter circuit connected between the output of said NAND gate and the control electrode of said second transfer gate switching element for that $m$th digit.

5. An incrementer circuit according to claim 4, wherein the control electrodes of the first and second transfer gate switching elements for the second lowest digit are connected to the output and input terminals, respectively, for the lowest digit.

6. An incrementer circuit according to claim 3, wherein said detector circuit comprises a NAND circuit.

7. An incrementer circuit according to claim 1, wherein said transfer gate circuit comprises:

($m$-1) first transfer gate switching elements connected in series between said inverter circuit and the output terminal for that particular $m$th digit, and ($m$-1) second transfer gate switching elements connected in parallel across the input and output terminals for that particular $m$th digit, and wherein said first transfer gate switching elements are controlled by the signals applied to the inputs of the lowest to the ($m$-1)th digit, and said second transfer gate switching elements are controlled by the outputs of the inverter circuits of the lowest digit to the ($m$-1)th digit.

8. An incrementer circuit according to claim 1, wherein said transfer gate circuit comprises:

a first transfer gate switching element connected in series between said inverter and the output terminal for that particular digit, a second transfer gate switching element connected across the input and output terminals for that particular digit, and wherein each $m$th coupling circuit for each of the third lowest to the $n$th digit further comprises a detector circuit having a plurality of inputs connected to the output terminals of the inverter circuit for the lowest to the ($m$-1)th digit and an output connected to the control electrode of the first transfer gate switching element, and an inverter circuit connected between the output of the detector circuit and the control electrode of the second transfer gate switching element, each detector circuit providing an output in response to each of its inputs being a "0".

9. An incrementer circuit according to claim 8, wherein said detector circuit comprises a NOR gate.

10. An incrementer circuit according to claim 1, wherein said transfer gate comprises:

a first transfer gate switching element connected in series between said inverter and the output terminal for that particular digit, a second transfer gate switching element connected across the input and output terminals for that particular digit, and wherein each $m$th coupling circuit for the third lowest to the $n$th digit further comprises a NOR circuit having first and second inputs connected to the output of the inverter circuit for the ($m$-1)th digit and the control electrode of the second transfer gate switching element for the ($m$-1)th digit, respectively, and an output connected to the control electrode of the first transfer gate switching element for that $m$th digit, and an inverter circuit connected between the output of said NOR gate and the control elelctrode of said second transfer gate switching element for that $m$th digit.

11. An incrementer circuit according to claim 10, wherein the control electrodes of the first and second transfer gate switching elements for the second lowest digit are connected to the input and output terminals, respectively, for the lowest digit.

* * * * *